(12) United States Patent
Inoue (10) Patent No.: US 10,685,860 B2
(45) Date of Patent: Jun. 16, 2020

(54) FLOW PATH MEMBER

(71) Applicant: KYOCERA Corporation, Kyoto-shi, Kyoto (JP)

(72) Inventor: Tomoyuki Inoue, Higashiomi (JP)

(73) Assignee: KYOCERA Corporation, Kyoto (JP)

( * ) Notice: Subject to any disclaimer, the term of this patent is extended or adjusted under 35 U.S.C. 154(b) by 556 days.

(21) Appl. No.: 15/100,200

(22) PCT Filed: Nov. 28, 2014

(86) PCT No.: PCT/JP2014/081630
§ 371 (c)(1),
(2) Date: May 27, 2016

(87) PCT Pub. No.: WO2015/080266
PCT Pub. Date: Jun. 4, 2015

(65) Prior Publication Data
US 2017/0040193 A1   Feb. 9, 2017

(30) Foreign Application Priority Data
Nov. 28, 2013   (JP) .................................. 2013-245823

(51) Int. Cl.
*H01L 21/683* (2006.01)
*H01L 21/67* (2006.01)
(Continued)

(52) U.S. Cl.
CPC ...... *H01L 21/67109* (2013.01); *C04B 37/005* (2013.01); *F28F 13/12* (2013.01);
(Continued)

(58) Field of Classification Search
CPC ....... F28F 21/04; C04B 37/005; H01L 23/367
(Continued)

(56) References Cited

U.S. PATENT DOCUMENTS

| 6,039,114 A | 3/2000 | Becker et al. | |
|---|---|---|---|
| 2012/0058044 A1* | 3/2012 | Musick | F28F 1/40 423/613 |
| 2015/0076685 A1* | 3/2015 | Abe | H01L 23/145 257/712 |

FOREIGN PATENT DOCUMENTS

| JP | H08-319181 A | 12/1996 |
|---|---|---|
| JP | H08319181 A * | 12/1996 |

(Continued)

OTHER PUBLICATIONS

International Search Report dated Feb. 24, 2015 by the Japanese Patent Office for International Application No. PCt/JP2014/081630.

*Primary Examiner* — Larry L Furdge
*Assistant Examiner* — Nael N Babaa
(74) *Attorney, Agent, or Firm* — Procopio Cory Hargreaves and Savitch LLP (57) ABSTRACT

There is provided a first substrate having a first main surface, a second substrate having a second main surface, a bonding member bonding the first main surface and the second main surface, and a flow path positioned between the first substrate and the second substrate and extended in a parallel direction with the first main surface and the second main surface, and the bonding member has a projection which is protruded from a portion between the first main surface and the second main surface toward an inner part of the flow path, the flow path includes a first portion having the projection provided in an inner part and a second portion linked to the first portion adjacently to an opposite side to a side where the projection of the first portion is provided, and a height of the first substrate is greater than a height of the second portion in the thickness direction.

8 Claims, 5 Drawing Sheets

(51) Int. Cl.
*H01J 37/32* (2006.01)
*C04B 37/00* (2006.01)
*F28F 13/12* (2006.01)
*F28F 21/04* (2006.01)

(52) U.S. Cl.
CPC ............ *F28F 21/04* (2013.01); *H01J 37/321* (2013.01); *H01J 37/3211* (2013.01); *H01J 37/32119* (2013.01); *H01J 37/32522* (2013.01); *H01L 21/6831* (2013.01); *C04B 2237/064* (2013.01); *C04B 2237/066* (2013.01); *C04B 2237/10* (2013.01); *C04B 2237/34* (2013.01); *C04B 2237/343* (2013.01); *C04B 2237/62* (2013.01); *C04B 2237/64* (2013.01); *F28F 2255/18* (2013.01)

(58) Field of Classification Search
USPC .......................................................... 165/170
See application file for complete search history.

(56) References Cited

FOREIGN PATENT DOCUMENTS

| JP | 11-506873 A | | 6/1999 |
|---|---|---|---|
| JP | 2003-309109 A | | 10/2003 |
| JP | 2003309109 A | * | 10/2003 |
| JP | 2013059707 A | * | 4/2013 |

* cited by examiner

with a first substrate having a first main surface, a second substrate having a second main surface, a bonding member bonding the first main surface and the second main surface, and a flow path positioned between the first substrate and the second substrate and extended in a parallel direction with the first main surface and the second main surface, wherein the bonding member has a projection which is protruded from a portion between the first main surface and the second main surface toward an inner part of the flow path, the flow path has a first portion having the projection provided in an inner part and a second portion linked to the first portion adjacently to an opposite side to a side where the projection of the first portion is provided, and a height of the first portion is greater than a height of the second portion.

FLOW PATH MEMBER

TECHNICAL FIELD

The present invention relates to a flow path member used for, for example, semiconductor manufacturing apparatuses or flat panel display (FPD) manufacturing apparatuses.

BACKGROUND ART

Conventionally, a flow path member having a flow path is used for semiconductor manufacturing apparatuses or FPD manufacturing apparatuses. For example, Patent Document 1 describes a dielectric window for a plasma processing apparatus (a flow path member) having a flow path for causing a coolant or a heating medium to flow as an example of the flow path member. The dielectric window for a plasma processing apparatus described in the Patent Document 1 regulates a temperature of the dielectric window for a plasma processing apparatus (a temperature of the flow path member itself) by causing the coolant or the heating medium to flow to the flow path.

The flow path member of the Patent Document 1 has a first dielectric plate (a first substrate), a second dielectric plate (a second substrate) and an adhesive (a bonding member) bonding the first substrate and the second substrate, and a cross section of the flow path in a perpendicular direction to a length direction of the flow path (a direction in which a coolant or a heating medium flows) takes a rectangular shape. Referring to the flow path member of the Patent Document 1, there is described an example in which the adhesive (the bonding member) for bonding the first dielectric plate (the first substrate) and the second dielectric plate (the second substrate) is slightly protruded up to an inner part of the rectangular flow path to bond the first dielectric plate and the second dielectric plate.

CITATION LIST

Patent Document

Patent Document 1: Japanese Unexamined Patent Publication No. 2003-309109

SUMMARY OF THE INVENTION

Problems to be Solved by the Invention

As described in the Patent Document 1, in some cases in which comparatively many bonding members are disposed in a bonded portion to strongly couple the first substrate and the second substrate when the first substrate and the second substrate are bonded to configure the flow path, the bonding member is protruded from a portion between the first substrate and the second substrate by pressing force in the bonding. When the bonding member is partially protruded into the flow path taking the rectangular cross section in the perpendicular direction to the length direction of the flow path (the direction in which the coolant or the heating medium flows), the shape of the flow path is partially changed irregularly by the protruded bonding member. In some cases, therefore, the coolant or the heating medium does not flow as designed so that a temperature condition of the flow path member is hard to be adjusted into a desirable state. The present invention meets demands to provide a flow path member which is excellent in a temperature control function.

Means for Solving the Problems

There is provided a flow path member including a first substrate having a first main surface, a second substrate having a second main surface, a bonding member bonding the first main surface and the second main surface, and a flow path positioned between the first substrate and the second substrate and extended in a parallel direction with the first main surface and the second main surface, wherein the bonding member has a projection which is protruded from a portion between the first main surface and the second main surface toward an inner part of the flow path, the flow path has a first portion having the projection provided in an inner part and a second portion linked to the first portion adjacently to an opposite side to a side where the projection of the first portion is provided, and a height of the first portion is greater than a height of the second portion.

Moreover, there is provided a method of manufacturing a flow path member including the steps of preparing a first ceramic forming substrate having a first main surface and a second ceramic forming substrate including a second main surface and a first groove portion provided on the second main surface, causing the first main surface and the second main surface to contact with each other through a ceramic paste, thereby forming a composite including the first ceramic forming substrate, the second ceramic forming substrate and the ceramic paste, and firing the composite, wherein at the step of forming the composite, the first ceramic forming substrate and the second ceramic forming substrate are pressed against each other to protrude the ceramic paste toward the first groove portion, and at the step of firing the composite, the firing is performed in a state in which the ceramic paste is protruded toward the first groove portion so that a first substrate obtained by firing the first ceramic forming substrate and a second substrate obtained by firing the second ceramic forming substrate are bonded to each other through a bonding member obtained by firing the ceramic paste and a projection of the bonding member which is protruded toward an inner part of the flow path is formed in a corresponding region to the first groove portion provided on a flow path formed between the first substrate and the second substrate.

Effects of the Invention

According to the flow path member in accordance with an embodiment of the present invention, the height of the first portion of the flow path having the projection of the bonding member disposed therein is made greater than the height of the second portion linked to the first portion. Consequently, a flow rate of a fluid around the projection is comparatively decreased and a turbulent flow generated in the projection is apt to stay within a range of the first portion. Thus a flow of the fluid in the second portion can be made stably rapid and the turbulent flow in the second portion can be lessened.

According to the method of manufacturing a flow path member in accordance with an embodiment of the present invention, in manufacture of the flow path member, the projection of the bonding member is disposed in the first groove portion having a comparatively great height. Therefore, invasion of the projection to the flow path other than the first groove portion is suppressed and a cross-sectional area of the flow path other than the first groove portion can easily be maintained into a desirable shape. Therefore, a fluid such as a coolant or a heating medium can be caused to flow stably to the flow path other than the first groove portion.

EMBODIMENTS FOR CARRYING OUT THE INVENTION

A flow path member according to an embodiment of the present invention will be described below in detail with reference to FIGS. 1 to 4.

A flow path member 1 according to the present embodiment is used as a heat exchanger for cooling or heating a predetermined member in a semiconductor manufacturing apparatus, an FPD manufacturing apparatus or the like, for example. The semiconductor manufacturing apparatus performs various processings over a semiconductor wafer, thereby manufacturing a semiconductor device. The FPD manufacturing apparatus performs various processings over a glass substrate, thereby manufacturing an FPD. In the present embodiment, description will be given by taking a plasma processing apparatus 2 for performing an etching processing or a film forming processing over a semiconductor wafer or a glass substrate as an example of the semiconductor manufacturing apparatus and the FPD manufacturing apparatus. Examples of the semiconductor manufacturing apparatus and the FPD manufacturing apparatus include an exposing apparatus and the like in addition to the plasma processing apparatus.

Figure 1:
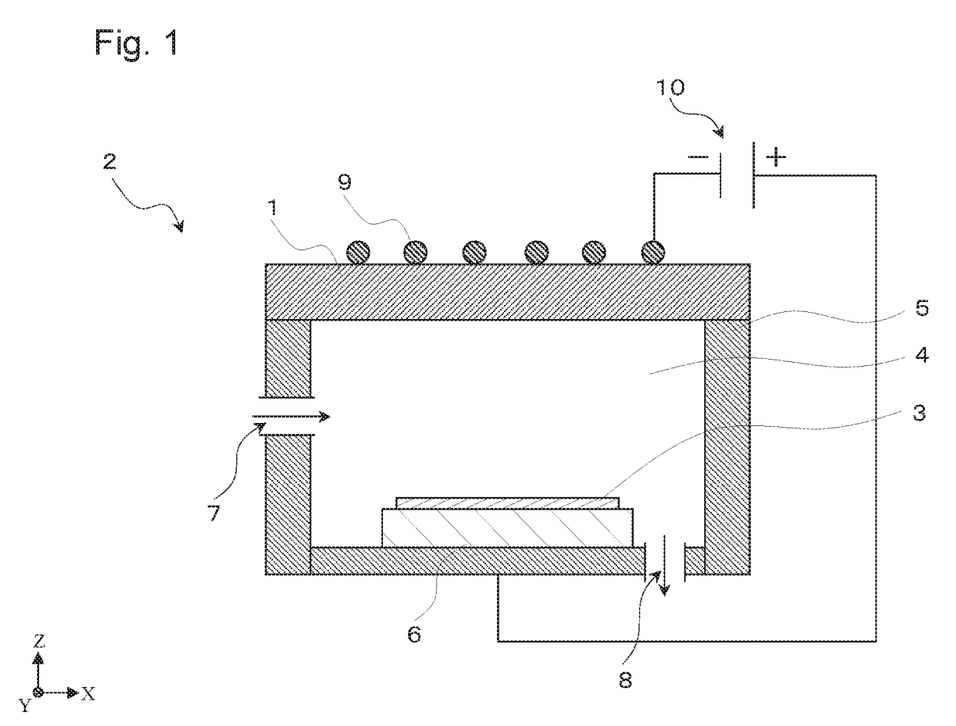
FIG. 1 is a cross-sectional view in a thickness direction of a plasma processing apparatus using a flow path member according to an embodiment of the present invention.

As shown in FIG. 1, the plasma processing apparatus 2 according to the present embodiment includes a chamber 5 in which a reaction chamber 4 for accommodating an object 3 such as a semiconductor wafer or a glass substrate is formed in an inner part, a chuck 6 such as an electrostatic chuck for adsorbing the object 3 in the reaction chamber 4, a supply port 7 for supplying a gas to the reaction chamber 4, an exhaust port 8 for discharging a gas from the reaction chamber 4, a coil 9 positioned on the chamber 5 and serving to apply a high frequency voltage into the reaction chamber 4, and a power supply 10 for applying a high frequency voltage to the coil 9.

The plasma processing apparatus 2 supplies a gas from the supply port 7 into the reaction chamber 4 and the coil 9 then generates an electric field in the reaction chamber 4, thereby generating a plasma in the reaction chamber 4. By the plasma, the object 3 is subjected to etching, film formation or the like.

The chamber 5 of the plasma processing apparatus 2 has a flow path member 1 which is positioned above the object 3 and supports the coil 9. The flow path member 1 functions as a dielectric window member through which a high frequency voltage generated by the coil 9 passes.

When the plasma processing apparatus 2 generates a plasma, the high frequency voltage is applied to the coil 9. The flow path member 1 to be the dielectric window member is subjected to inductive heating by the high frequency voltage. An intensity of the high frequency voltage passing through the flow path member 1 is spatially ununiform depending on a shape of the coil 9 and a degree of heating of the flow path member 1 is also apt to be partially varied depending on a variation in the intensity of the high frequency voltage. In the case in which a temperature in each portion of the flow path member 1 is made ununiform due to the partial variation in the degree of the heating of the flow path member 1, a plasma intensity in the reaction chamber 4 is also apt to be spatially ununiform. In the present embodiment, the flow path member 1 including a flow path 16 through which a coolant or a heating medium passes is used as the dielectric window member to reduce a temperature distribution of the flow path member 1 (the dielectric window member), thereby enhancing uniformity of the plasma intensity in the reaction chamber 4 comparatively.

Figure 3A:
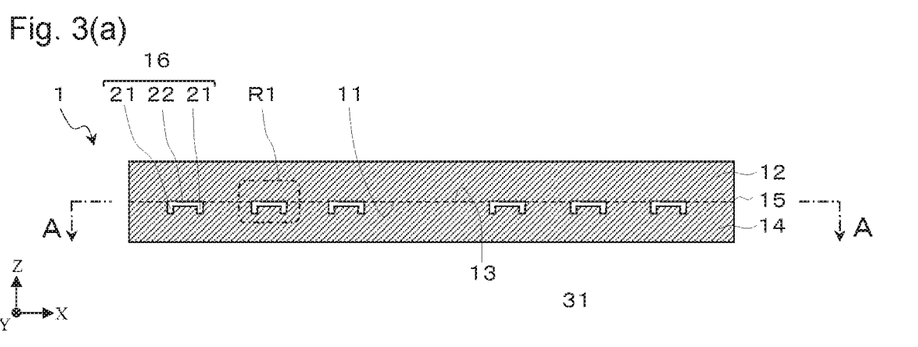
FIG. 3(a) is a cross-sectional view taken along a thickness direction of the flow path member illustrated in FIG. 2(b) and along a perpendicular direction to a length direction of the flow path (a direction in which a coolant or a heating medium flows)
Figure 3B:
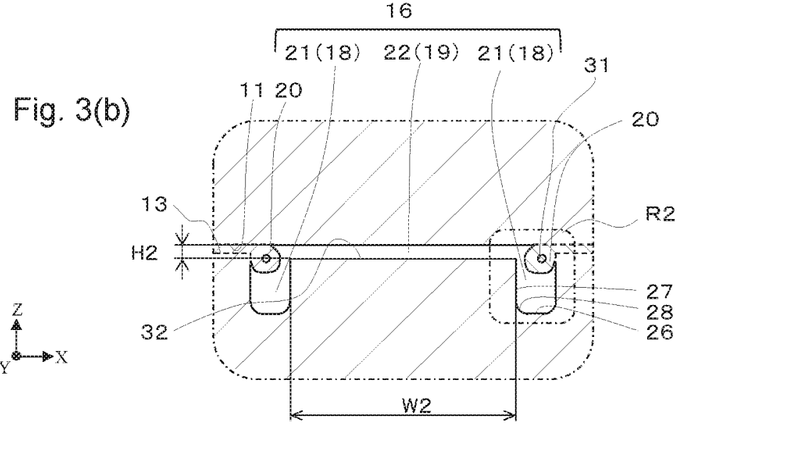
FIG. 3(b) is an enlarged view showing an R1 portion in FIG. 3(a)
Figure 3C:
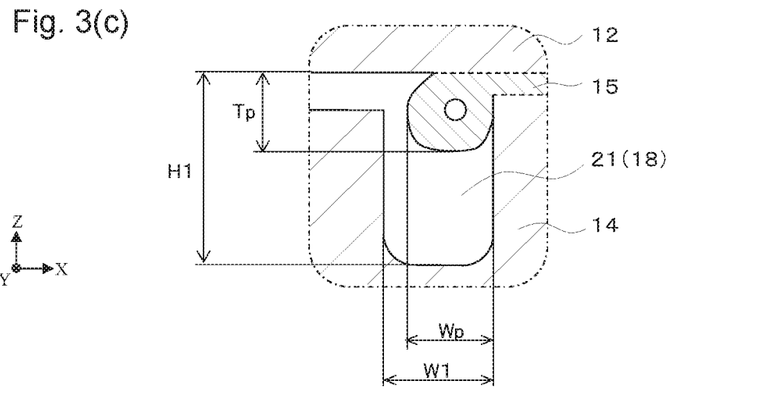
FIG. 3(c) is an enlarged view showing an R2 portion in FIG. 3(b).

As shown in FIG. 3, the flow path member 1 includes a first substrate 12 having a first main surface 11, a second substrate 14 having a second main surface 13 bonded to the first main surface 11, a bonding member 15 bonding the first main surface 11 and the second main surface 13, and the flow path 16 positioned between the first substrate 12 and the second substrate 14 in a direction which is parallel with the first main surface 11 and the second main surface 13. The flow path 16 is a space surrounded by the first substrate 12, the second substrate 14 and the bonding member 15. The bonding member 15 has a projection 20 which is protruded from a portion between the first main surface 11 and the second main surface 13 toward an inner part of the flow path 16, the flow path 16 has a first portion 21 having the projection 20 provided therein and a second portion 22 linked to the first portion 21 adjacently at an opposite side to a side where the projection 20 of the first portion 21 is provided, and a height H1 of the first portion 21 is greater than a height H2 of the second portion 22. The height H1 of the first portion 21 and the height H2 of the second portion 22 are heights in a thickness direction of the first substrate 12 and the second substrate 14 (a z direction in the drawing). In the example shown in FIG. 3, the flow path 16 has the second portion 22 and two first portions 21 disposed with the second portion 22 interposed therebetween.

Figures 2A, 2B:
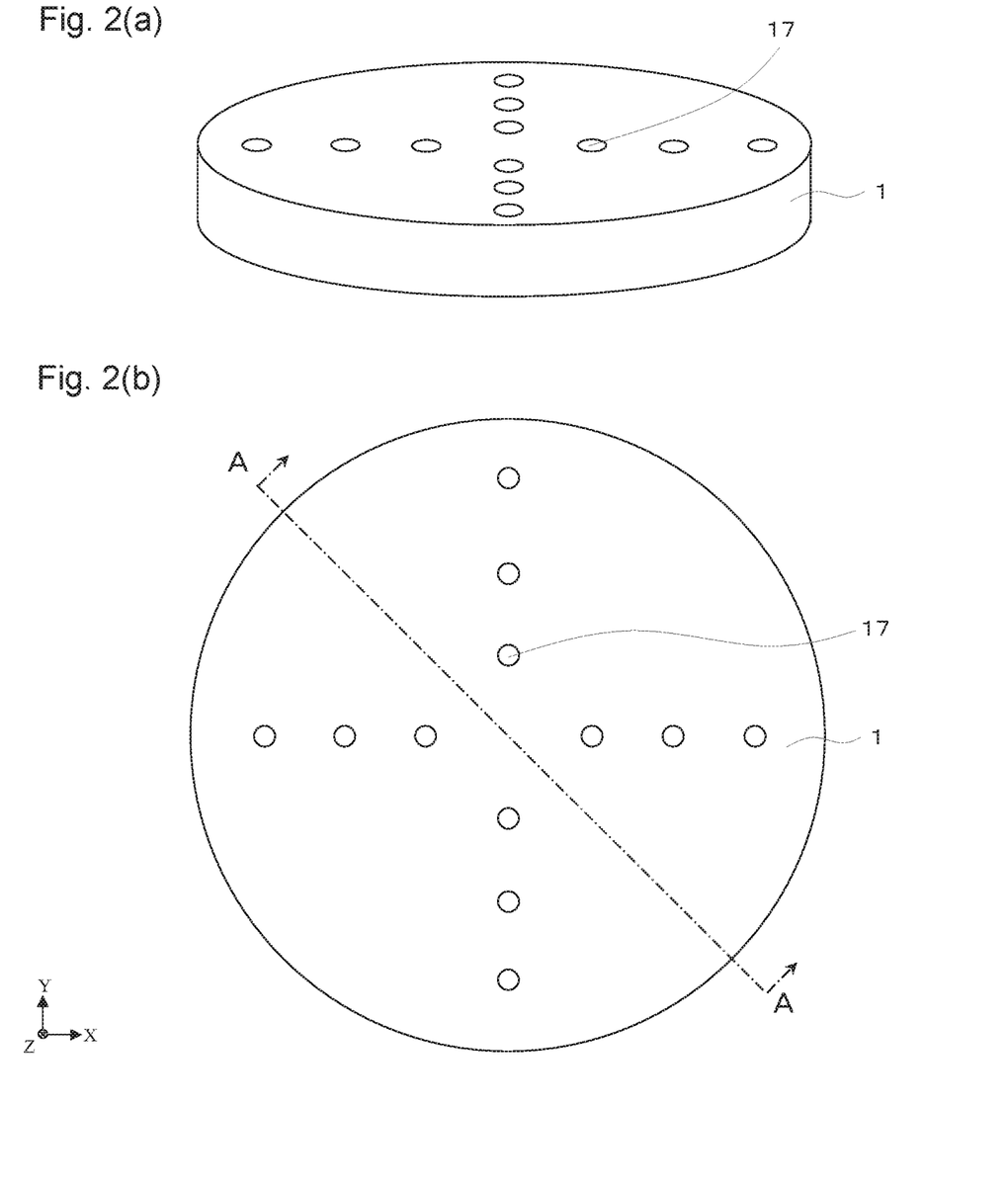
FIG. 2(a) is a perspective view showing the flow path member illustrated in FIG. 1.
FIG. 2(b) is a plan view showing the flow path member illustrated in FIG. 2(a).

As shown in FIG. 2, the flow path member 1 also includes a through hole 17 penetrating at least either of the first substrate 12 and the second substrate 14 in the thickness direction (the z direction). The through hole 17 is linked to the flow path 16 and functions as a hole for supplying a fluid to the flow path 16 or a hole for discharging a fluid from the flow path 16. An opening of the through hole 17 is connected to fluid supplying means (not shown) for supplying and discharging a fluid. The through hole 17 may penetrate only one of the first substrate 12 and the second substrate 14 or may penetrate both the first substrate 12 and the second substrate 14 in the thickness direction.

The first substrate 12 is formed by a ceramic sintered body such as an alumina sintered body, an yttria sintered body, a YAG sintered body or a spinel sintered body, for example. Above all, it is desirable that the first substrate 12 should be formed by the alumina sintered body. The first substrate 12 according to the present embodiment takes a shape of a disk seen on a plane as shown in FIG. 2, for example. A thickness of the first substrate 12 is equal to or greater than 2 mm and is equal to or smaller than 50 mm, for example. A width (a diameter) of the first substrate 12 is equal to or greater than 100 mm and is equal to or smaller than 1000 mm, for example. The second substrate 14 is formed by the ceramic sintered body containing the same main component as the first substrate 12. Materials of the second substrate 14 and the first substrate 12 are not particularly restricted but the main components of the second substrate 14 and the first substrate 12 do not need to be identical. If the second substrate 14 is formed by the ceramic sintered body containing the same main component as the first substrate 12, however, respective linear expansion coefficients of the first substrate 12 and the second substrate 14 are close to each other and a thermal stress acting between the first substrate 12 and the second substrate 14 is controlled even if heating and cooling are repeated. Therefore, it is possible to reduce peeling of the first substrate 12 and the second substrate 14.

The bonding member 15 is formed by a ceramic sintered body such as an alumina sintered body, an yttria sintered body, a YAG sintered body or a spinel sintered body, a glass or the like, for example. It is desirable that the bonding member 15 should be formed by the ceramic sintered body containing the same main component as the first substrate 12 and the second substrate 14. In this case, respective linear expansion coefficients of the first substrate 12, the second substrate 14 and the bonding member 15 are close to each other so that the peeling of the first substrate 12 and the second substrate 14 can be reduced.

In the case in which the main component of the bonding member 15 is formed by the ceramic sintered body containing the same main component as the first substrate 12 and the second substrate 14, the bonding member 15 can be confirmed in the following manner, for example. First of all, the flow path member 1 is cut away in a direction which is parallel with the thickness direction of the first substrate 12 and the second substrate 14 (the z direction in the drawing) and is perpendicular to the length direction of the flow path 16 (the direction in which the coolant or the heating medium flows), and this cross section (a cross section corresponding to FIG. 3) is subjected to mirror polishing. Next, this cross section is observed by using a digital microscope manufactured by KEYENCE CORPORATION, for example. In this observation, there is observed a range in which the first substrate 12, the bonding member 15 and the second substrate 14 come in sight. By this observation, it is possible to observe regions having relatively small numbers of voids which correspond to the first substrate 12 and the second substrate 14 and regions having relatively large numbers of voids (closed pores 31) which are interposed between regions corresponding to the first substrate 12 and the second substrate 14. The region having the relatively large number of voids (the closed pores 31) is equivalent to a region corresponding to the bonding member 15.

A fluid (a coolant or a heating medium) for regulating the temperature of the flow path member 1 flows to the flow path 16. The fluid performs heat exchange with a peripheral part of the flow path 16 so that the temperature of the flow path member 1 is regulated. For the fluid, it is possible to use a coolant such as water or oil.

As described above, in the flow path member 1, the bonding member 15 has the projection 20 which is protruded from the portion between the first main surface 11 and the second main surface 13 toward the inner part of the flow path 16, the flow path 16 has the first portion 21 having the projection 20 provided therein and the second portion 22 linked to the first portion 21 adjacently to the opposite side to the side where the projection 20 of the first portion 21 is disposed, and the height H1 of the first portion 21 is greater than the height H2 of the second portion 22. The bonding member 15 is provided to be protruded such that the projection 20 is disposed in the flow path 16. Consequently, it is possible to increase a bonding strength so as to perform bonding over a whole region other than the flow path 16 and to suppress the peeling of the first substrate 12 and the second substrate 14 by inhibiting invasion of a fluid to the portion between the first substrate 12 and the second substrate 14 through the bonding member 15.

In the flow path member 1, thus, the height H1 of the first portion 21 where the projection 20 of the bonding member 15 is disposed is made greater than the height H2 of the second portion 22 linked to the first portion 21. Consequently, a speed of a flow of the fluid around the projection 20 is reduced comparatively and a turbulent flow caused by the projection 20 is apt to stay within the range of the first portion 21. In other words, the height H1 of the first portion 21 where the projection 20 is disposed is increased comparatively so that a cross-sectional area of the flow path 16 around the projection 20 which is apt to be decreased by the projection 20 is increased comparatively and a flow velocity of the fluid can be prevented from being excessively increased in the vicinity of the projection 20. Consequently, a degree of the turbulent flow caused by the projection 20 is controlled to be low. In addition, by the increase in the cross-sectional area of the flow path 16 in the vicinity of the projection 20, influence of the turbulent flow generated in the first portion 21 is transferred to the second portion 22 with difficulty. For this reason, in the flow path member 1, the speed of the flow of the fluid in the second portion 22 can be comparatively high and the turbulent flow in the second portion 22 can be lessened. Consequently, the fluid (the coolant or the heating medium) can be caused to flow to the second portion 22 of the flow path 16 in a comparatively rapid and stable state. In other words, the second portion 22 is caused to mainly have a function of the flow path. Therefore, the flow path member 1 easily regulates the temperature of the flow path member 1 itself into a desirable condition.

The first portion 21 of the flow path 16 includes a first groove portion 18 provided on the second main surface 13 of the second substrate 14. In the example shown in FIG. 3, moreover, the second portion 22 of the flow path 16 includes a second groove portion 19 which is linked to the first groove portion 18 adjacently along the first groove portion 18 and has a smaller depth than the first groove portion 18. In the flow path member 1, a region interposed between a bottom surface 32 of the second groove portion 19 of the second substrate 14 and the first main surface 11 of the first substrate 12 corresponds to the second portion 22 of the flow path 16, and a region interposed between an internal surface of the first groove portion 18 of the second substrate 14 and the first main surface 11 of the first substrate 12 corresponds to the first portion 21. The second groove portion 19 is not always required. In that case, the height H2 of the second portion 22 indicates an interval between the main surface of the second substrate 14 and the main surface of the first substrate 12 and is equivalent to the thickness of the bonding member 15. From a viewpoint of the strength of the flow path member 1, it is preferable that the thickness of the bonding member 15 should be small. In order to increase the cross-sectional area of the flow path 16 (the second portion 22 of the flow path 16) to make a higher flow rate of the fluid flowing through the flow path 16, therefore, it is preferable that the second groove portion 19 should be provided.

By providing the first groove portion 18 and disposing the projection 20 in the first groove portion 18, thus, it is possible to provide the projection 20 in extension in the depth direction (the z direction) of the first groove portion 18. Consequently, a distance between the surface of the projection 20 and the second portion 22 of the flow path 16 can be comparatively great. The same first groove portion may be provided on only the first substrate 12 in place of the second substrate 14. Moreover, the same first groove portion may be provided on both the second substrate 14 and the first substrate 12. The second groove portion 19 may be provided in the same way.

The first groove portion 18 has a bottom surface 26, a side surface 27 connected to the bottom surface 26 and an inclined surface 28 disposed between the bottom surface 26 and the side surface 27. In other words, in the case in which the shape of the first groove portion 18 seen on a cross section is rectangular, for example, a rectangular corner part is cut (corner cutting). The region corresponding to the first groove portion 18 in the flow path 16 has a comparatively large cross-sectional area and the flow of the fluid is apt to be slow. In some cases in which the first groove portion 18 does not have the inclined surface 28 and the cross section shown in FIG. 3 takes a rectangular shape having a corner part, for example, the flow velocity of the fluid is remarkably low in the corner part so that heat exchange in the portion corresponding to the corner part cannot be fully performed. The flow path member 1 has the inclined surface 28 between the bottom surface 26 and the side surface 27 so that reduction in the flow velocity in the corner part is suppressed. Although the inclined surface 28 takes a curved shape in the flow path member 1 in the example shown in FIG. 3(b), the inclined surface 28 may take a planar shape.

In the flow path member 1, it is preferable that a thickness Tp in the thickness direction of the first substrate 12 and the second substrate 14 in the projection 20 should be greater than the height H2 of the second portion 22. By the provision of the projection 20 within a comparatively wider range than the height H2 of the second portion 22, thus, the fluid flowing at a comparative high flow velocity through the second portion 22 is prevented from directly abutting on a boundary part between the first substrate 12 and the second substrate 14 so that the peeling of the first substrate 12 and the second substrate 14 is suppressed more reliably.

In the flow path 16, a width W2 of the second portion 22 is greater than the width W1 of the first portion 21. The width W1 of the first portion 21 and the width W2 of the second portion 22 in the flow path 16 are lengths in an orthogonal direction to the thickness direction of the first substrate 12 and the second substrate 14 and the length direction of the flow path 16 (an x direction in FIG. 3). By increasing the width W2 of the second portion 22 which substantially functions as the flow path, consequently, it is possible to enhance a degree of heat exchange in the second portion 22. Thus, it is possible to stably regulate the temperature of the flow path member 1 by the fluid flowing stably in the second portion 22.

Figure 4A:
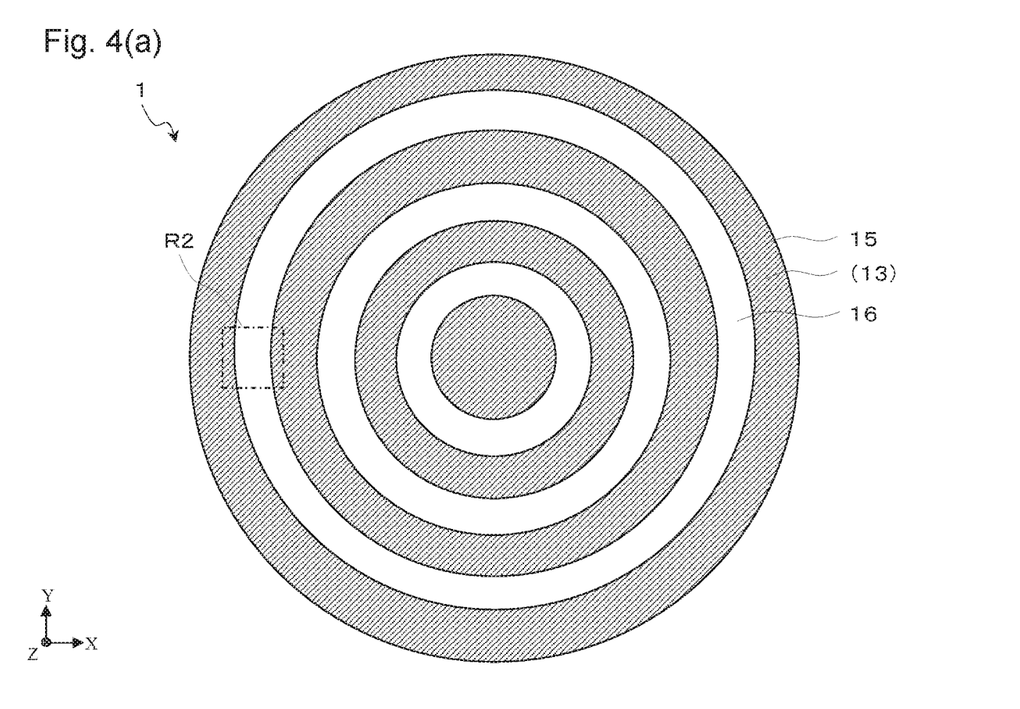
FIG. 4(a) is a cross-sectional view taken along an A-A line in FIG. 3(a) and FIG. 4(b) is an enlarged view showing an R2 portion in FIG. 4(a).
Figure 4B:
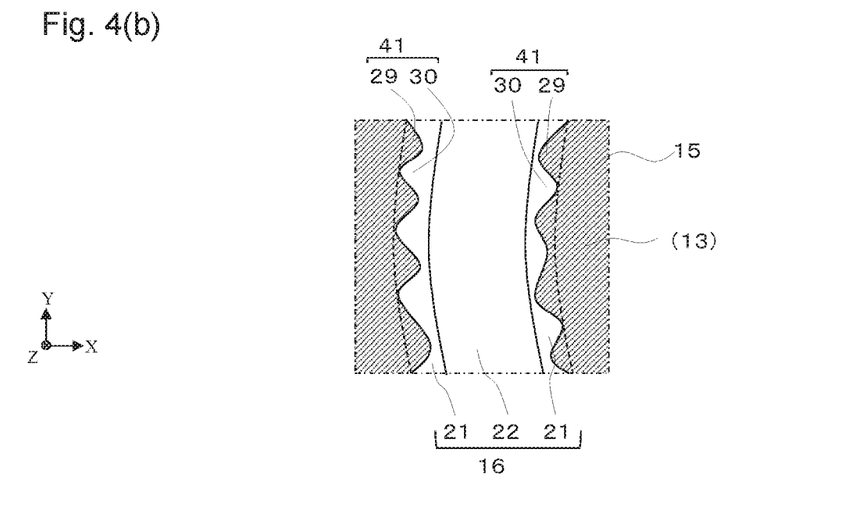

As shown in FIG. 4, the projection 20 has a convex part 29 to be convexed and a concave part 30 to be concaved toward the flow path 16 (the second portion 22) in a surface part at an opposite side to the second portion 22, and has a concave-convex region 41 in which the concave part 30 and the convex part 29 are disposed alternately in the length direction of the flow path 16. In the example shown in FIG. 4, the flow path member 1 has a plurality of annular flow paths 16 disposed concentrically, and the concave-convex region 41 of the flow path 16 is annularly disposed continuously over the whole surface part at the opposite side to the second portion 22 of each flow path 16. By disposing the concave-convex region 14, it is possible to generate a stable turbulent flow in the first portion 21 in which the projection 20 is provided. Consequently, there is controlled a temperature distribution of the flow path member 1 with a local turbulence of the degree of the heat exchange caused by local generation of the turbulent flow, local peeling of the first substrate 12 and the second substrate 14 which is caused by the local turbulent flow or the like.

Figures 5A, 5B:
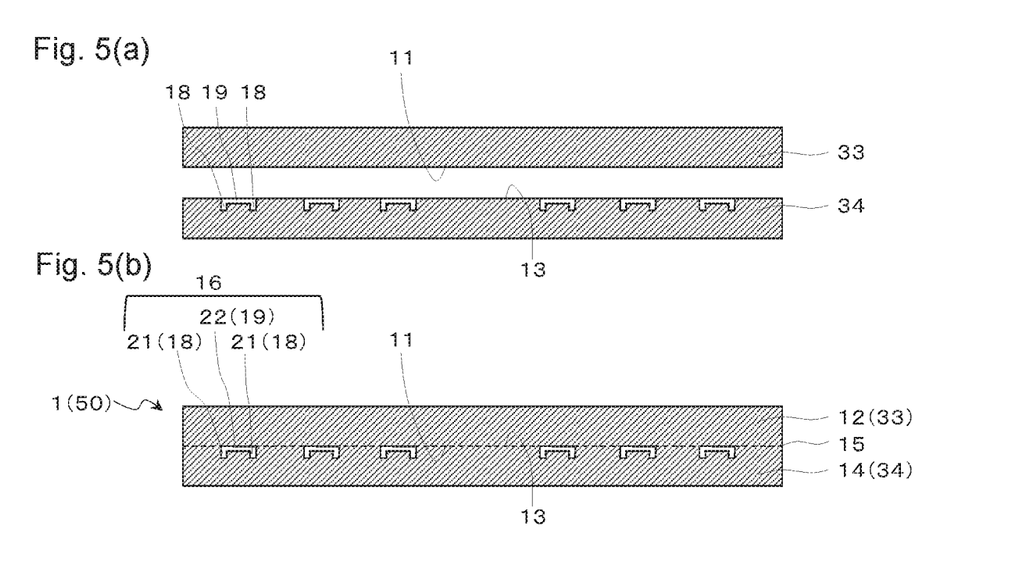
FIGS. 5(a) and 5(b) are cross-sectional views taken along a thickness direction, showing a process for manufacturing the flow path member illustrated in FIG. 1.

The height H1 of the first portion 21 of the flow path member 1 is equal to or greater than 2 mm and is equal to or smaller than 30 mm, for example. The height H2 of the second portion 22 is equal to or greater than 0.1 mm and is equal to or smaller than 2 mm, for example. The width W1 of the first portion 21 is equal to or greater than 1 mm and is equal to or smaller than 10 mm, for example. The width W2 of the second portion 22 is equal to or great than 5 mm and is equal to or smaller than 100 mm, for example. The thickness Tp of the projection 20 is equal to or greater than approximately 0.1 mm and is equal to or smaller than approximately 11 mm, for example. A width Wp of the projection 20 is smaller than the width W1 of the first portion 21 and is equal to or greater than approximately 0.5 mm and is equal to or smaller than approximately 10 mm, for example. In the case in which the concave-convex region 41 is provided, the width Wp of the projection 20 is partially varied within a range of approximately 0.5 mm or more to approximately 10 mm or less, for example, and the convex parts 29 and the concave parts 30 having the width Wp within the range of approximately 0.5 mm or more to approximately 10 mm or less are disposed alternately, for example. Next, a method of manufacturing the flow path member 1 will be described by taking, as an example, the case in which the first substrate 12 the second substrate 14 and the bonding member 15 are composed of ceramic sintered bodies of which the main component is the same. FIG. 5 is a cross-sectional view for explaining an example of the method of manufacturing the flow path member. In the following description and FIG. 5, explanation will be given with a part of structures having reference numerals corresponding to the finished flow path member 1 also in a state of a process for fabricating the flow path member 1.

For example, the method of manufacturing the flow path member 1 has a step of preparing a first ceramic forming substrate 33 having the first main surface 11 and a second ceramic forming substrate 34 including the second main surface 13 and the first groove portion 18 provided on the second main surface 13, a step of causing the first main surface 11 and the second main surface 13 to contact with each other through a ceramic paste (not shown), thereby forming a composite 50 including the first ceramic forming substrate 33, the second ceramic forming substrate 34 and the ceramic paste, and a step of firing the composite 50. At the step of forming a composite, the first ceramic forming substrate 32 and the second ceramic forming substrate 34 are pressed against each other to protrude the ceramic paste toward the first groove portion 18. At the step of firing a composite, the firing is performed in a state in which the ceramic paste is protruded toward the first groove portion 18. Consequently, the first substrate 12 obtained by firing the first ceramic forming substrate 33 and the second substrate 14 obtained by firing the second ceramic forming substrate 34 are bonded to each other through the bonding member 15 obtained by firing the ceramic paste, and furthermore, the flow path 16 provided with the projection 20 of the bonding member 15 protruded toward the inner part of the flow path 16 is formed in a corresponding region to the first groove portion 18 of the flow path 16.

More specifically, first of all, there are prepared the first ceramic forming substrate 33 having the first main surface 11 and the second ceramic forming substrate 34 including the second main surface 13 and the first groove portion 18 provided on the second main surface 13 as shown in FIG. 5(a). Specifically, it is sufficient to fabricate the first ceramic forming substrate 33 and the second ceramic forming substrate 34 in the following procedure, for example. After pure water and an organic binder are added to ceramic powder, wet blending is performed by a ball mill to make a slurry. Next, the slurry is formed into granules by spray dry. Subsequently, the granulated ceramic powder is formed by using various forming methods to make the first ceramic compact 33. Referring to the second ceramic compact 34, the second groove portion 19 having the bottom surface 32 which is parallel with the second main surface 13 and the first groove portion 18 linked to the second groove portion 19 are formed on the ceramic compact fabricated in exactly the same manner as the first ceramic compact 33. The second groove portion 19 and the first groove portion 18 can be formed by cutting the second ceramic compact 34, for example. As described above, both the first ceramic compact 33 and the second ceramic compact 34 are ceramic compacts containing the same main component.

Next, the first main surface 11 and the second main surface 13 are caused to contact with each other through a ceramic paste (not shown) to form the composite 50 including the first ceramic forming substrate 33, the second ceramic forming substrate 34 and the ceramic paste. In this case, the first ceramic forming substrate 32 and the second ceramic forming substrate 34 are pressed against each other to protrude the ceramic paste toward the first groove portion 18.

It is sufficient to use a ceramic paste obtained by mixing ceramic powder and pure water. It is preferable that the ceramic powder containing the same main component as the first compact 33 and the second compact 34 should be used. It is sufficient to use a ceramic paste having a moisture rate (a rate of percentage of pure water to the entire ceramic paste) of 40 mass % more and 80 mass % or less, for example. The viscosity of the ceramic paste may be adjusted by a thickener such as an organic matter.

The ceramic paste is selectively applied onto the second main surface 13 of the second compact 34 so that a thickness after the application is equal to or greater than 0.1 mm and is equal to or smaller than 2 mm. In this case, a mesh is disposed on the second main surface 13 of the second compact 34 and the ceramic paste is then applied through the mesh. Consequently, the ceramic paste is applied uniformly and the thickness of the ceramic paste is regulated. In the application, moreover, a humidity is set to be equal to or higher than 50% RH so that the ceramic paste is prevented from being dried and the moisture rate of the ceramic paste is maintained.

Next, the first main surface 11 of the first compact 33 is caused to contact with the second main surface 13 of the second compact 34 where the ceramic paste is applied. After the abutment is thus performed, the bonding member is pressurized at a pressure of 4.9 kPa or more and 98.1 kPa or less in a thickness direction for 0.5 hour or more so that a part of the ceramic paste is protruded (that is, is caused to project) from a portion between the first main surface 11 and the second main surface 13 toward the inner part of the first groove portion 18. In this case, the ceramic paste is applied and the first main surface 11 of the first compact 33 is then caused to contact with the second main surface 13 of the second compact 34 for a comparatively short period of time so that the ceramic paste can be prevented from being dried before bonding and the moisture rate of the ceramic paste can be maintained. Thus, the composite 50 is fabricated.

Next, the composite 50 is fired. At the step of firing the composite 50, the firing is performed at 1400° C. or more and 1800° C. or less in the state in which the ceramic paste is protruded (is caused to project) toward the first groove portion 18, for example. Consequently, the first substrate 12 obtained by firing the first ceramic forming substrate 33 and the second substrate 14 obtained by firing the second ceramic forming substrate 34 are bonded to each other through the bonding member 15 obtained by firing the ceramic paste and the flow path member 1 including the flow path 16 having the projection 20 disposed in the corresponding region to the first groove portion 18 of the flow path 16 can be formed.

The second ceramic compact 34 includes the first groove portion 18. Therefore, even if the first ceramic compact 32 and the second ceramic compact 34 are pressed by sufficient force when the first ceramic compact 32 and the second ceramic compact 34 are bonded to each other through the ceramic paste, the ceramic paste protruded by the pressing force is apt to be included in the comparatively large range of the first groove portion 18 and the cross-sectional shape of the second portion 22 of the flow path member 16 is prevented from being partially changed by the protruded ceramic paste (the projection 20). Moreover, the protruded portion is disposed in the first groove portion 18. Consequently, the projection 20 can be disposed in the first portion 21 of the flow path 16 of the flow path member 1 which is manufactured and the various functions and effects described above can be realized.

The present invention is not restricted to the embodiment but various changes, improvements, combinations and the like can be made without departing from the gist of the present invention.

EXPLANATION OF REFERENCE NUMERALS

1: flow path member
2: plasma processing apparatus
3: object
4: reaction chamber
5: chamber
6: chuck
7: supply port
8: exhaust port
9: coil
10: power supply
11: first main surface
12: first substrate
13: second main surface
14: second substrate
15: bonding member
16: flow path
17: through hole
18: first groove portion
19: second groove portion
20: projection
21: first portion 22: second portion
26: first bottom surface
27: side surface
28: inclined surface
29: convex part
30: concave part
31: aperture
32: second bottom surface
33: first compact
34: second compact

The invention claimed is:

1. A flow path member comprising:
    a first substrate having a first main surface;
    a second substrate having a second main surface;
    a flow path positioned between the first main surface and the second main surface; and
    a bonding material that has been pressed between the first main surface and the second main surface so as to protrude into the flow path;
    wherein the flow path comprises at least one peripheral groove, which accommodates the protruding bonding material, and is greater in height than a central portion of the flow path in a cross-sectional view that is perpendicular to a length direction of the flow path.

2. The flow path member according to claim 1, wherein the at least one peripheral groove is formed in the second main surface of the second substrate.

3. The flow path member according to claim 1, wherein the at least one peripheral groove has a bottom surface, a side surface connected to the bottom surface, and an inclined surface disposed between the bottom surface and the side surface.

4. The flow path member according to claim 1, wherein the protruding bonding material is greater in height than the central portion of the flow path in the cross-sectional view.

5. The flow path member according claim 1, wherein the central portion of the flow path is wider than the at least one peripheral groove.

6. The flow path member according to claim 1, wherein the protruding bonding material has a convex part and a concave part toward the central portion and has a concave-convex region in which the concave part and the convex part are disposed alternately in the length direction of the flow path.

7. The flow path member according to claim 1, wherein the flow path comprises two peripheral grooves with the central portion interposed therebetween.

8. The flow path member according claim 1, wherein the first substrate, the second substrate, and the bonding material are composed of ceramic sintered bodies of which the main component is the same.

* * * * *